United States Patent [19]
Glusker et al.

[11] Patent Number: 5,730,605
[45] Date of Patent: Mar. 24, 1998

[54] COMPRESSION CONNECTOR

[75] Inventors: Mark J. Glusker, San Mateo; David J. Lima, Los Altos; Michael A. Koken, Sunnyvale; Sung Kim, Palo Alto; Bruno Lucien Andre Richet, Redwood City, all of Calif.

[73] Assignee: Silicon Graphics, Inc.

[21] Appl. No.: 713,283

[22] Filed: Sep. 12, 1996

[51] Int. Cl.⁶ ............................................. H01R 0/09
[52] U.S. Cl. ............................ 439/67; 439/372; 439/289
[58] Field of Search ............................ 439/62, 67, 493, 439/157, 372, 77, 289, 700, 260, 259

[56] References Cited

U.S. PATENT DOCUMENTS

5,041,003  8/1991  Smith et al. ........................... 439/259
5,549,479  8/1996  Elco et al. ............................. 439/67

*Primary Examiner*—Khiem Nguyen
*Assistant Examiner*—Yong Ki Kim
*Attorney, Agent, or Firm*—Wagner, Murabito & Hao

[57] ABSTRACT

A compression connector including a cam which securely attaches the compression connector to the backplate hook is disclosed. Specifically, in one embodiment, a backplate hook including pins located inside the receptacle is disclosed. The connector may be securely attached to the backplate hook by engaging the handle of the cam such that the cam and a second cam rotate so as to engage the pins. The movement of the cam handle compresses the connector against the surface to which the backplate hook is mounted, thus achieving a connection which is positive and which locks the connector into a position of uniform compression.

21 Claims, 7 Drawing Sheets

COMPRESSION CONNECTOR

TECHNICAL FIELD

The present claimed invention relates to the field of electrical connectors. More specifically, the present claimed invention relates to an improved compression connector.

BACKGROUND ART

Prior art connection mechanisms for physically and electrically connecting one circuit board to another typically involves the use of standard card edge connectors or pin-in-socket connectors which simply slide into connector receptacles located on the motherboard. Typically, one circuit board will have a connector attached to it which includes a row of contact pins aligned in a plane parallel to the surface of the board. Each of the contact pins is typically connected by a conductive wire to a contact pad located on the circuit board. The connector is mated to a connector receptacle which is attached to the second circuit board. The connector receptacle typically includes a slot adapted to receive the contact pins. The connector receptacle includes conductive receptacles which electrically contact each of the contact pins. Each of the conductive receptacles is typically connected by a wire to a contact pad located on the second circuit board. The two connectors are typically held together by the tight tolerance between the housing of the connector and the structure of the slot of the connector receptacle. The tight tolerance between the contact pins and the conductive receptacles themselves also acts to hold the two boards together, thereby maintaining the electrical connection.

However, as signal processing speeds increase, these prior art connection mechanisms are not practical for use due to inherent signal delay. Signal delay results from the impedance mismatch between the circuit board and the pins of the connector, resulting in overlapping or lost electrical signals. Thus, a need exists for a connecting mechanism which provides impedance matching so as to eliminate the problems associated with signal delay. In an attempt to meet this need, recently designed prior art connection mechanisms include mechanisms which use a flex circuit in lieu of individual contact pins in combination with a compression connector. However, although prior art connection mechanisms which use a flex circuit in combination with a compression connector solve the problem of signal delay, the connection mechanism often does not make adequate contact with the circuit board to which the connection mechanism is coupled. In addition, the contact varies from installation to installation.

Figure 1:
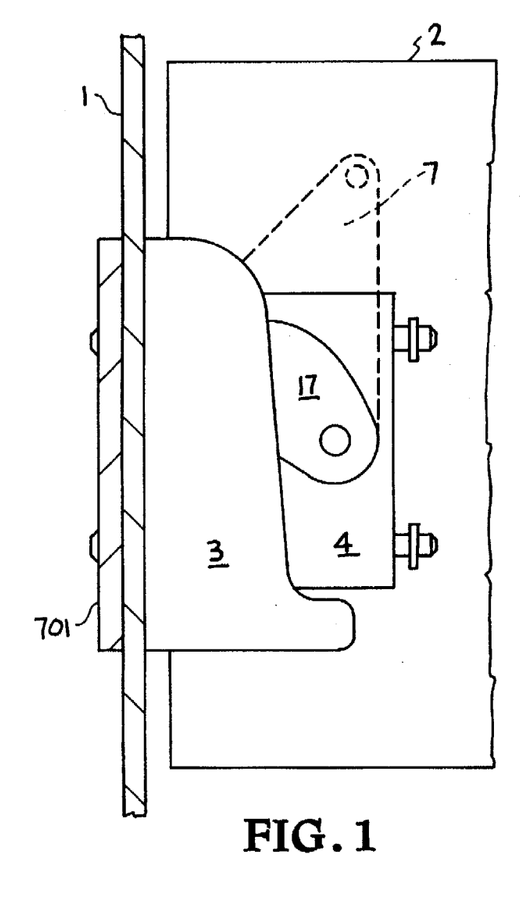
FIG. 1 is a side view illustrating a daughterboard coupled to a motherboard in accordance with the present invention.
Figure 1A:
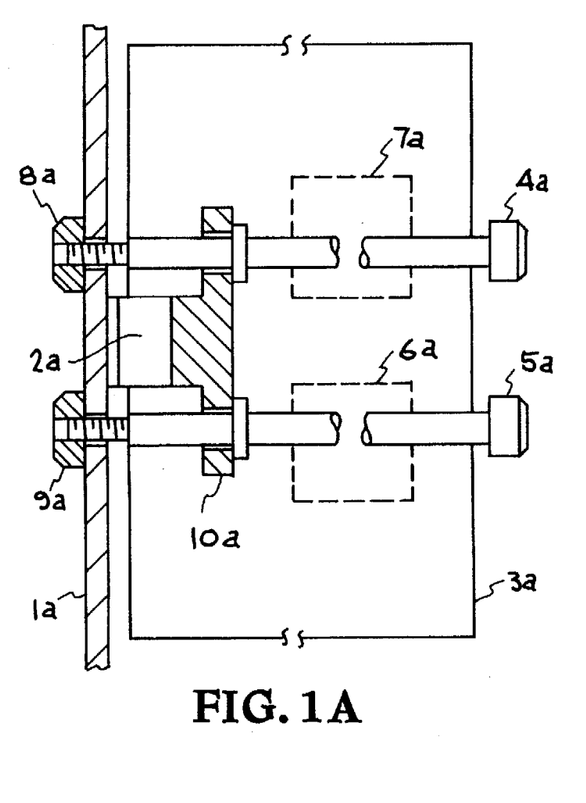
FIG. 1a is a side view of a prior art connection mechanism.

FIG. 1A shows a prior art connection mechanism which uses compression connector 2a and a flex circuit which is not shown. The compression connector 2a is attached to circuit board 3a. Circuit board 3a is mounted to motherboard 1a by screw 4a and screw 5a which screw into backing plates 8a and 9a. Prior art methods for connecting the circuit board 1a to circuit board 3a simply involve pressing the contact pads of the flex connector into corresponding contact pads located on the motherboard 1a. The daughter board 3a is then secured to the mother board 1a by screwing screws 4a and 5a into bar 10a which is attached to the connection mechanism 2a such that the screws 4a and 5a penetrate openings in the motherboard and are screwed into backing plates 8a-9a on the back side of the motherboard 1a. In order for screws 4a and 5a a to be accessible they must extend to the back of the daughterboard. Thus, the screws 4a-5a are quite long. Typically, depending on the size of the daughterboard, screws 4a-5a have a length of ten inches or longer. Some of the problems associated with this type of attachment include the fact that the screws 4a-5a act as antennas, thus creating radio frequency emissions in excess of allowable limits. Furthermore, the installation of the screws 4a-5a is difficult and time consuming. The resulting contact between the pads of the flex circuit and the pads on the motherboard varies from installation to installation, sometimes resulting in incomplete contact for one or more contact pads. In addition, the screws 4a-5a take up room that could be used for attaching other components to the daughterboard such as SIMMs and memory boards. For example, SIMMs and memory cards cannot be placed into attachment regions 6a-7a because of the screws 4a-5a.

In some recent prior art connection mechanisms which include a compression connector and a flex circuit, the long screws are mounted on the edges of the daughterboard so as to minimize physical interference with the circuit board surface. This solves the problem of screws blocking regions of the daughterboard that could be used for mounting electrical devices to the daughterboard. However, this mounting structure still requires the laborious screwing-in of each of the long screws. In addition, the problems associated with incomplete and insufficient contact and problems arising from the screws acting as antennas are not solved.

What is needed is a method and apparatus for achieving a uniform connection between two circuit boards which is suitable for high speed signal throughput. Furthermore, a connection mechanism is required that allows for easy engagement and disengagement and which establishes a consistent and predictable level of compression force. More specifically, a connection mechanism which will apply enough force to assure that there is adequate and even compression and which will apply sufficient pad pressure against each contact pad on the motherboard is required.

DISCLOSURE OF THE INVENTION

The present invention meets the above need with a connection mechanism which achieves a uniform and positive contact between the contact pads of a flex circuit and the contact pads of both circuit boards. The above achievement has been accomplished by using a connection mechanism including cams which draw the connection mechanism towards posts attached to one of the circuit boards.

In one embodiment of the present invention a backplate hook having two posts is attached to one circuit board which may be referred to as the motherboard. A connection mechanism which includes a flex circuit and a compression connector including two cams mounted to a camshaft is connected to the second circuit board which may be referred to as the daughterboard. Once the daughterboard is placed against the motherboard, the camshaft is rotated such that the cams engage the posts of the backplate hook so that the daughterboard is moved towards the motherboard and is locked into a position which transfers a predetermined amount of compression to the connection mechanism. As a result of the uniform positive pressure applied by the connection mechanism, constant displacement and uniform contact is achieved between the contact pads of the flex circuit and the contact pads of the motherboard.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

With reference now to FIG. 1, a daughterboard 2 is shown to be mounted to motherboard 1. The motherboard 1 includes backplate hook 3 which is screwed into backing plate 701 so as to secure the backplate hook 3 to the motherboard 1. Compression connector 4 is securely attached to the daughterboard 2. Compression connector 4 mates with a backplate hook 3 such that cam 7 and cam 17 may be engaged so as to lock compression connection connector 4 securely to backplate hook 3 such that a uniform tension is achieved at the junction between the electrical pads of the motherboard and the electrical pads of the flex circuit of the compression connector 4.

Figure 2:
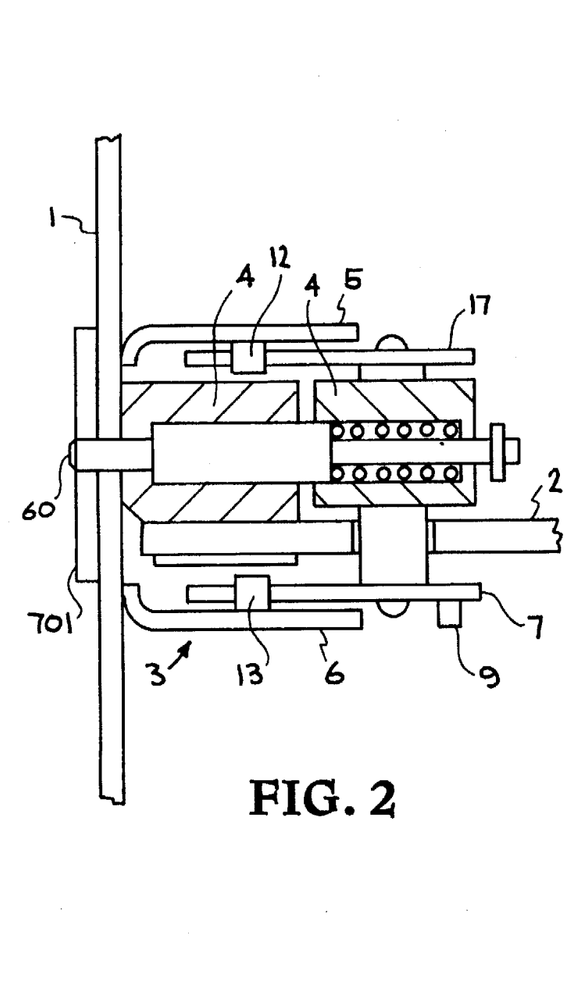
FIG. 2 is a bottom cross sectional view along axis A—A of FIG. 1 illustrating a daughterboard coupled to a motherboard in accordance with the present invention.

FIG. 2 illustrates motherboard 1 and the daughterboard 2 which are securely connected by compression connector 4. Compression connector 4 engages backplate hook 3 and is locked in position by cam 7 and cam 17 which engage post 12 and post 13. Cam handle 9 allows for the easy manipulation of cam 7 and cam 17. Backplate hook 3 is secured to the motherboard 1 by backing plate 701. Backplate hook 3 includes flange 5 and flange 6 and which guide compression connector 4 into the proper location as compression connector 4 is inserted towards backplate hook 3. Flange 5 and flange 6 further act to secure the daughterboard to backplate hook 3. Compression connector 4 does not require long mounting screws to couple it to the motherboard such as the long mounting screws used in prior art systems. Therefore, components may be mounted onto those regions of the daughterboard 2 which are not covered by compression connector 4. Thus, the connection mechanism does not take up as much of the surface area of the daughterboard 2 as do prior art designs, allowing for more components to be mounted onto the daughterboard. In addition, since long mounting screws are not required, problems associated with the long mounting screws of prior art systems acting as antennas is solved.

Figure 3:
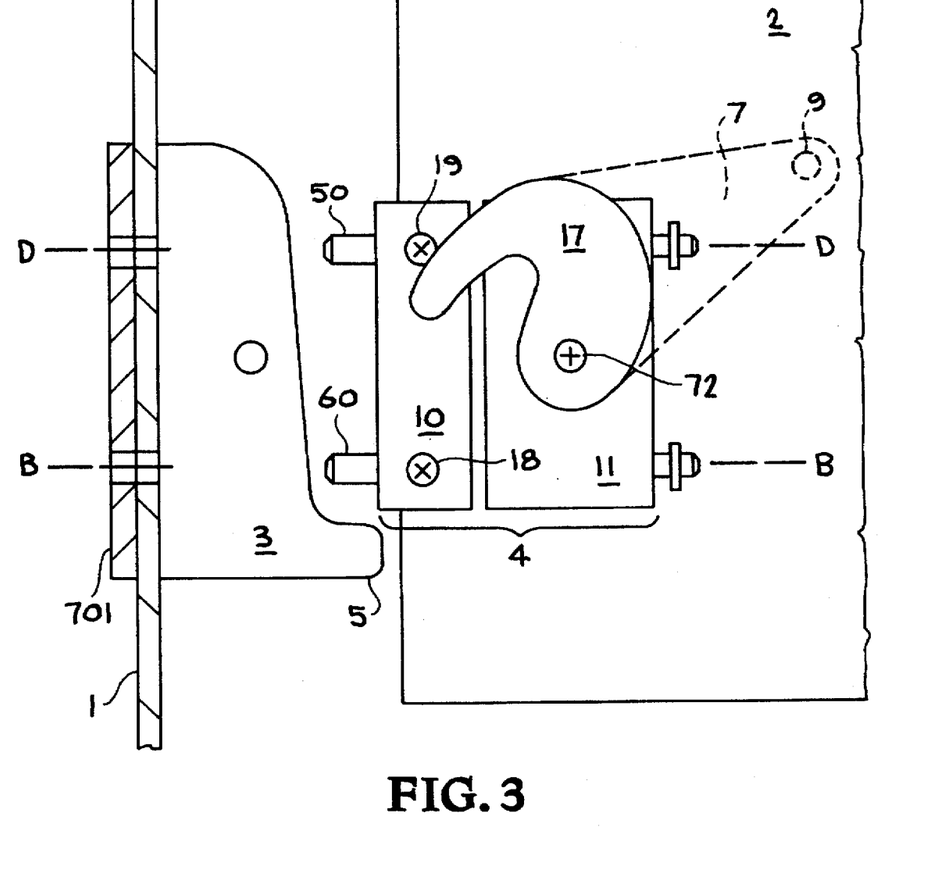
FIG. 3 is a side view illustrating a motherboard onto which a backplate hook is mounted and a daughterboard onto which a connection mechanism is mounted in accordance with the present invention.

FIG. 3 shows a side view of motherboard 1 and daughterboard 2 which are uncoupled. Backplate hook 3 is attached to motherboard 1 by backing plate 701. Flange 6 extends out from the main body of backplate hook 3. Compression connector 4 is securely attached to daughterboard 2 by screws 18–19. Compression connector 4 includes a main block 10 which is connected by guide pin 50 and guide pin 60 to mechanical block 11. The cam 17 which is attached by screw 72 is coupled to cam 7 which includes cam handle 9 such that, upon the rotation of cam handle 9, the cam 7 and the cam 17 rotate.

Figure 4:
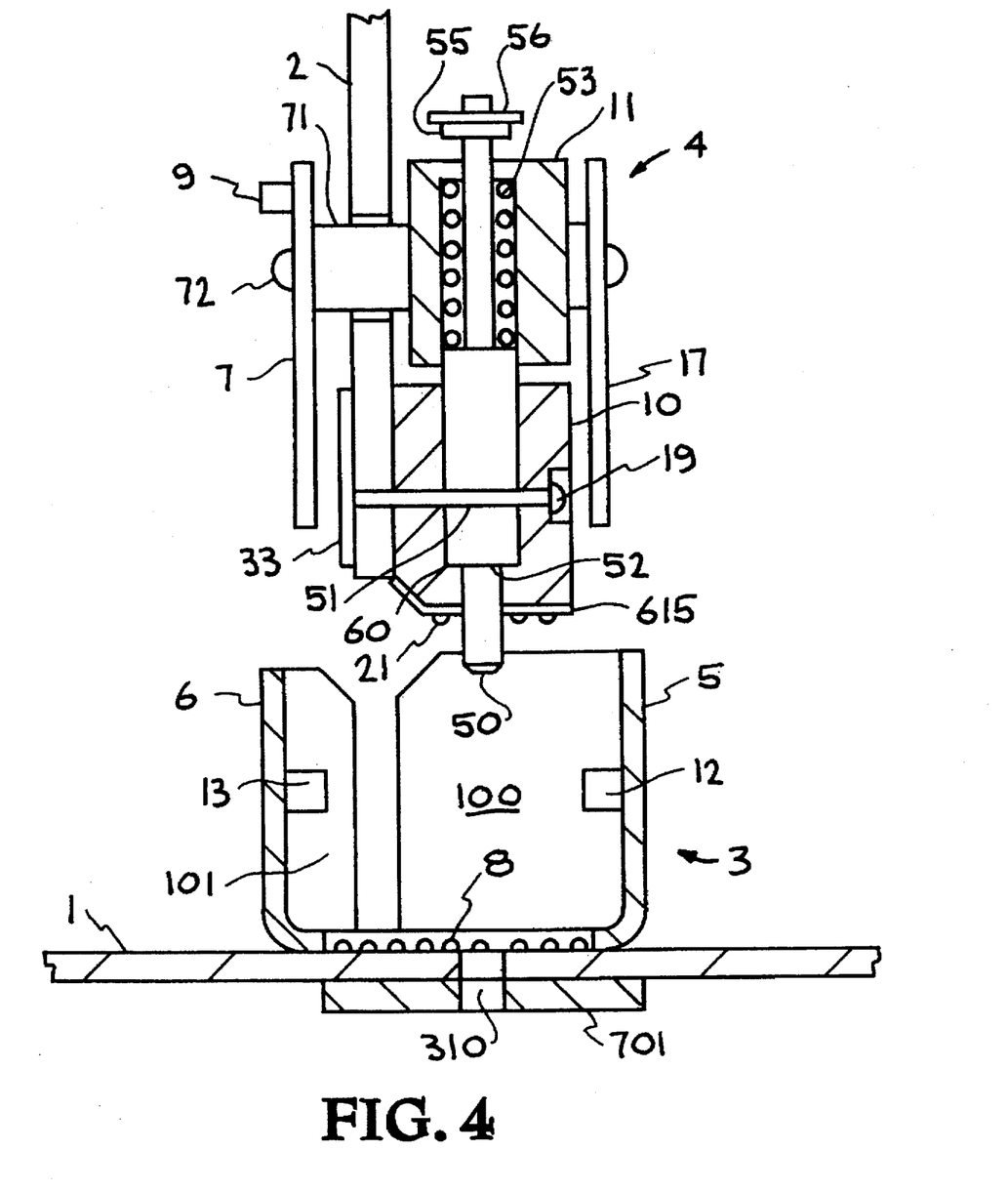
FIG. 4 is a top cross sectional view along axis D—D of FIG. 3 illustrating a motherboard onto which a backplate hook is mounted and a daughterboard onto which a connection mechanism is mounted in accordance with the present invention.

FIG. 4 shows backplate hook 3 to include post 12 and post 13 which extend from flange 5 and flange 6 respectively. The locking mechanism includes cam 7 and cam 17 which are located on the compression connector 4 such that they can engage post 12 and post 13. Backplate hook 3 includes a opening which is sufficient to expose array of contact pads 8 located on the motherboard 1. Backplate hook also includes tension region 100 and tension region 101 which guide the daughterboard 2 and the compression connector 4 into proper alignment with motherboard 1. Electrical coupling to motherboard 1 is accomplished by making electrical contact between array of contact pads 21 located on the flex circuit 601 and array of contact pads 8 which is formed directly on the surface of the motherboard 1. The daughterboard 2 is secured to motherboard 1 by placing daughterboard 2 against motherboard 1. Flange 5 and flange 6 guide compression connector 4 into the proper position for mating compression connector 4 to backplate hook 3.

It can be seen that screw 19 passes through opening 52 to backing plate 33 so as to couple the main block 10 to the daughter board 2. Stop-face 52 of guide pin 50 rests against stop face 80 of main block 10 as a result of the force of spring 53. Spring 53 contacts with the mechanical block 11 so as to create a gap between the main block 10 and the mechanical block 11. This gap is approximately twenty thousandths of an inch. Motherboard 1 includes guide pin opening 310 such that compression connector 4 may be precisely located by the insertion of guide pin 50 within the guide pin opening 310. Precise location of the compression connector 4 allows conductive pads of the array of contact pads 8 to contact respective array of contact pads 21 of flex circuit 601.

Figure 5:
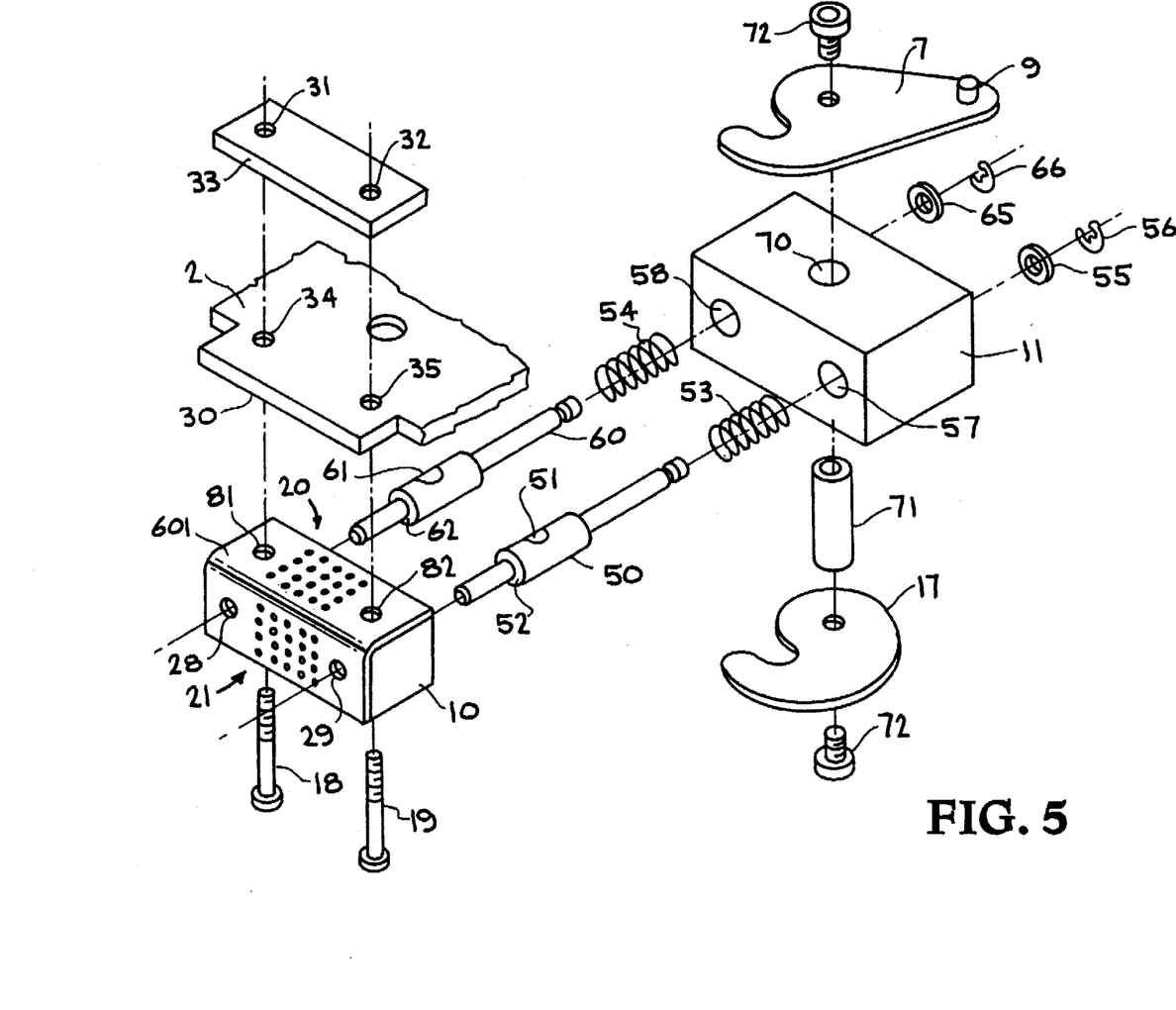
FIG. 5 is an exploded perspective view of a daughterboard having a connection mechanism mounted onto it in accordance with the present invention.

FIG. 5 shows an exploded perspective view of the components which make up compression connector 4. Flex circuit 601 makes electrical contact with daughterboard 2 at array of contact pads 30. Flex circuit 601 includes array of contact pads 20 and array of contact pads 21. The main block 10 is coupled to daughterboard 2 by screw 18 and screw 19 which are inserted into screw hole 81 and screw hole 82. The screw 18 passes through screw hole 81 and through flex circuit 601 and through opening 34 of daughterboard 2 to engage threaded opening 81 of backing plate 33. Similarly, screw 19 passes through screw hole 82 and through flex circuit 601 and through opening 35 of daughterboard 2 and engages threaded opening 82 of backing plate 33 to securely couple main block 10 to daughterboard 2. Upon attachment of main block 10 to daughterboard 2, array of contact pads 20 make electrical contact with array of contact pads 30 of daughterboard 9.

Main block 10 is coupled to the mechanical block 11 by guide pin 50 and guide pin 60. In the engaged state, the springs 53 and 54 force stop-face 52 and stop-face 62 up against a corresponding stop-face in openings 28 and 29. Opening 51 in guide pin 50 and opening 61 in guide pin 60 allow for guide pins 50 and 60 to freely move within a narrow range within opening 28 and opening 29. One end of guide pin 50 extends through opening 57 of mechanical block 11 and is contained therein by washer 55 and retainer ring 56. Similarly, one end of guide pin 60 extends through opening 58 of mechanical block 11 and is contained therein by washer 65 and retainer ring 66. Cam shaft 71 is disposed within opening 70. Screw 72 couples the cam shaft 71 to cam 7 and cam 17. Cam shaft 71 is disposed within opening 70 of mechanics/block 11 such that cam 7 and cam 17 may freely rotate about an axis running perpendicular to the centerline of cam shaft 71.

Figure 6:
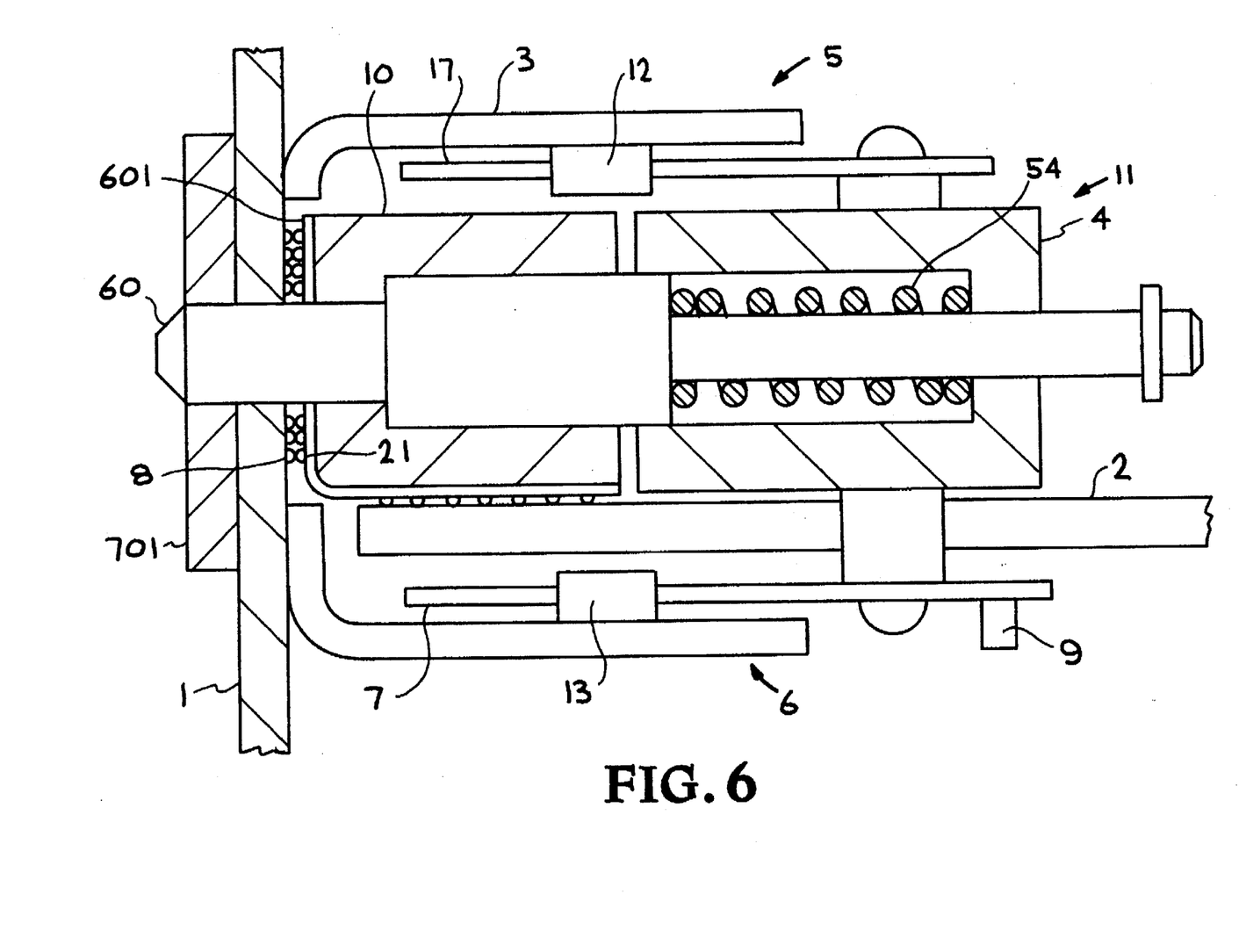
FIG. 6 is a bottom cross sectional view along axis A—A of FIG. 1 illustrating a daughterboard coupled to a motherboard in accordance with the present invention.

FIG. 6 shows the structure of FIG. 4 upon coupling connector 4 with backplate hook 3 so as to securely couple daughterboard 2 to motherboard 1. Daughterboard 2 is coupled to the motherboard 1 by rotating cam handle 9 so as to rotate cam 7 and cam 17. As cam 7 rotates, it engages post 13. Similarly, as cam 17 rotates it engages post 12 so as to pull compression connector 4 towards motherboard 1. As cam handle 9 moves into the locked position daughterboard 2 is securely coupled to motherboard 1. Flange 5 and flange 6 guide the daughterboard and compression connector 14 into the backplate hook 3. In the locked position, the shape of cam 7 and the shape of cam 17 engage with post 12 and post 13 such that cam 7 and cam 17 will not rotate unless cam handle 9 is engaged. Thus, a locking position is achieved which securely fastens compression connector 4 to the backplate hook 3. In the locked position, the engagement of cams 7 and 17 into posts 12 and 13 has drawn the mechanical block 11 closer to main block 10 and closer to motherboard 1 so as to compress spring 54. The spring force is transmitted to the compression connector 4 through guide pin 60 which is coaxial with spring 54. The engagement of the mechanism to the locked position presses array of contact pads 21 of flex circuit 601 onto array of contact pads 8 so as to positively electrically couple array of contact pads 21 of flex circuit 601 to array of contact pads 8. As a result of the uniform positive pressure applied to compression connector 4, uniform contact is achieved between array of contact pads 21 of flex circuit 601 and the array of contact pads 8 on motherboard 1.

Figure 7:
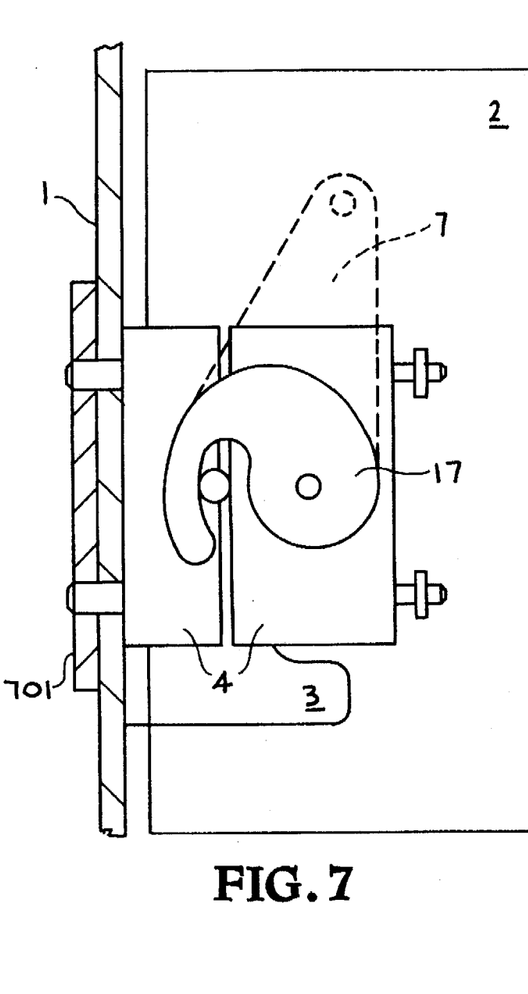
FIG. 7 is a cross sectional view along axis E—E of FIG. 6 illustrating a daughterboard coupled to a motherboard in accordance with the present invention.

FIG. 7 shows how cam 17 engages post 12 so as to couple daughterboard 2 to motherboard 1. The contour of cam 17 holds the post 12 such that the post is engaged with the surface of cam 17 so as to achieve a locked position. The locked position positively couples the motherboard 1 to the daughterboard 2. Guide pin 50 and guide pin 60 align compression connector 4 with motherboard 1.

Figure 8:
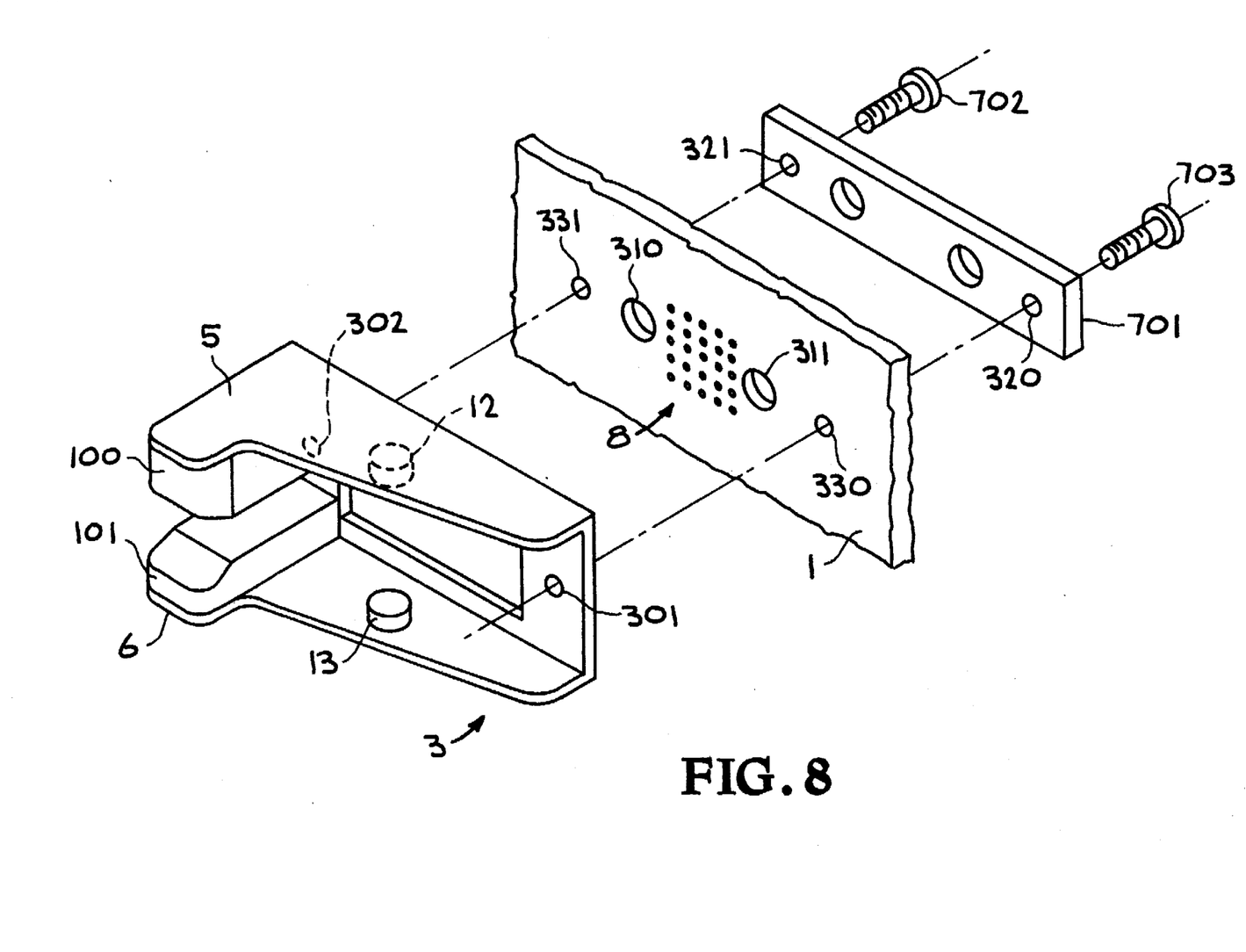
FIG. 8 is an exploded perspective view of a backplate hook mounted to a circuit board in accordance with the present invention.

FIG. 8 shows an exploded perspective view of backplate hook 3. Guide pin opening 310 and guide pin opening 311 lie on opposite sides of contact pads 8. Tension region 100 and tension region 101 are shown to extend from flange 5 and flange 6. Backplate hook 3 is attached to motherboard 1 by screw 702 and screw 703 which pass through opening 320 and opening 321 in backing plate 701 and pass through openings 330 and 331 of the motherboard 1 and screw into threaded openings 301 and 302, in backplate hook 3. Motherboard 1 includes guide pin openings 310 and 311.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

We claim:

1. A connection mechanism for mounting a first circuit board to a second circuit board comprising:

a backplate hook, said backplate hook mounted on a first circuit board such that said backplate hook overlies a connective region of said first circuit board, said backplate hook having an open region such that said connective region of said first circuit board is exposed, said backplate hook including a post; and a compression connector, said compression connector mounted to a connective region of said second circuit board such that said compression connector is electrically connected to said second circuit board, said compression connector including a cam shaft and having a cam coupled thereto, said cam configured such that upon the insertion of said compression connector into said backplate hook, rotation of said cam engages said post of said backplate hook thereby compressing said compression connector against said connective region of said first circuit board such that said first circuit board is electrically connected to said second circuit board.

2. The connection mechanism for mounting a first circuit board to a second circuit board of claim 1 wherein said compression connector further comprises:

a flex circuit having a first and a second array of contact pads, said second array of contact pads of said flex circuit electrically connected to said connective region of said second circuit board, said first array of contact pads disposed such that when said cam engages said post of said backplate hook, said first array of contact pads are compressed against said connective region of said first circuit board thereby electrically coupling said connective region of said first circuit board to said connective region of said second circuit board such that said first circuit board is electrically connected to said second circuit board.

3. The connection mechanism for mounting a first circuit board to a second circuit board of claim 2 further comprising:

a plurality of contact pads disposed on said first connective region; and a plurality of contact pads disposed on said second connective region such that when such that when said cam engages said post of said backplate hook, each of said plurality of contact pads disposed on said first connective region is electrically connected to a respective contact pad of said first array of contact pads and each of said plurality of contact pads disposed on said second connective region is electrically connected to a respective contact pad of said second array of contact pads such that said contact pads of said second circuit board are electrically connected to said contact pads of said first circuit board.

4. The connection mechanism for mounting a first circuit board to a second circuit board of claim 3 wherein said cam includes a cam handle.

5. The connection mechanism for mounting a first circuit board to a second circuit board of claim 4 further comprising:
   a second post extending from said backplate hook; and
   a second cam coupled to said cam such that, upon the movement of said cam handle, said cam and said second cam rotate such that said second cam may engage said second post.

6. The connection mechanism for mounting a first circuit board to a second circuit board of claim 5 wherein said first array of contact pads are formed by depositing a layer of copper over said first circuit board.

7. The connection mechanism for mounting a first circuit board to a second circuit board of claim 6 wherein said cam and said second cam have a contour such that said cam and said second cam may engage said post and said second post so as to lock said cam and said second cam into an engaged position.

8. The connection mechanism for mounting a first circuit board to a second circuit board of claim 7 wherein said cam and said second cam are disposed on opposite sides of said second circuit board.

9. The connection mechanism for mounting a first circuit board to a second circuit board of claim 7 wherein said backplate hook further comprises:
   a first tension region extending from the inside of said backplate hook; and
   a second tension region extending from the inside of said backplate hook such that said first tension region and said second tension region guide said second circuit board into proper alignment with said first circuit board.

10. A connection mechanism for mounting a daughterboard onto a circuit board comprising:
    a backplate hook, said backplate hook mounted to said circuit board, said backplate hook including a mounting post;
    a compression connector housing, said compression connector housing coupled to said daughterboard, said compression connector housing including a first block and a second block, said first block connected to said second block;
    a flex circuit, said flex circuit including a first connective region and a second connective region, said second connective region electrically connected to said daughterboard and said first connective region mounted to said compression connector housing; and
    a cam, said cam connected to said compression connector housing such that upon the insertion of said compression connector into said backplate hook, said cam may be rotated so as to engage said post so as to press said first connective region against said circuit board, thereby electrically connecting said daughterboard to said circuit board.

11. The connection mechanism for mounting a daughterboard onto a circuit board of claim 10 further comprising:
    a first alignment opening in said circuit board;
    a second alignment opening in said circuit board;
    a first alignment pin coupled to said first block and coupled to said second block so as to couple said first block to said second block; and
    a second alignment pin coupled to said first block and coupled to said second block so as to couple said first block to said second block such that upon the insertion of said compression connector into said backplate hook, said first alignment pin enters said first alignment opening and said second alignment pin enters said second alignment opening such that said compression connector housing is properly aligned with said circuit board.

12. The connection mechanism for mounting a daughterboard onto a circuit board of claim 11 wherein said daughterboard includes a plurality of contact pads and wherein said circuit board includes a plurality of contact pads such that upon the insertion of said compression connector into said backplate hook, said cam may be rotated so as to engage said post so as to press said first connective region against said circuit board, thereby electrically connecting each of said contact pads of said daughterboard to said contact pads of said circuit board.

13. The connection mechanism for mounting a daughterboard onto a circuit board of claim 12 wherein said contact pads of said first connective region comprise copper.

14. The connection mechanism for mounting a daughterboard onto a circuit board of claim 13 wherein said contact pads of said second connective region comprise copper.

15. The connection mechanism for mounting a daughterboard onto a circuit board of claim 10 wherein said cam includes a cam handle.

16. The connection mechanism for mounting a daughterboard onto a circuit board of claim 10 wherein said cam has a locking position such that, upon the insertion of said compression connector into said backplate hook, said cam may be rotated into said locking position, thereby engaging said post such that said daughterboard is securely locked to said circuit board.

17. A connection mechanism for mounting a first circuit board to a second circuit board comprising:
    a first mounting post connected to a first circuit board;
    a second mounting post connected to said first circuit board;
    a flex circuit having a second connective region coupled to a second circuit board and a first connective region;
    a first cam attached to said second circuit board such that said first cam may rotate so as to engage said first mounting post, thereby pulling said second circuit board towards said first circuit board such that said first connective region is compressed against said first circuit board; and
    a second cam attached to said first cam such that, upon the rotation of said first cam, said second cam rotates so as to engage said second mounting post, thereby pulling said second circuit board towards said first circuit board such that said first connective region is compressed against said first circuit board.

18. The connection mechanism of claim 17 further comprising:
    a plurality of contact pads disposed on said first circuit board; and a plurality of contact pads disposed on said first connective region such that each of said contact pads on said first connective region is electrically connected to a respective contact pad on said first circuit board.

19. The connection mechanism of claim 17 wherein said first cam further comprises a handle, said handle allowing for the easy rotation of said cam.

20. The connection mechanism of claim 19 further comprising a backplate hook having an inner first side surface and an inner second side surface and wherein said first mounting post extends from said inner first side surface and wherein said second mounting post extends from said inner second side surface.

21. The connection mechanism of claim 20 further comprising:
- a compression connector, said first cam and said second cam coupled to said compression connector;
- a first flange formed in said backplate hook; and
- a second flange formed in said backplate hook such that, upon the insertion of said connection mechanism into said backplate hook, said first flange and said second flange contact said compression connector so as to guide said compression connector into proper alignment with said backplate hook.

* * * * *